United States Patent
Sysak et al.

(10) Patent No.: US 8,111,729 B2
(45) Date of Patent: Feb. 7, 2012

(54) MULTI-WAVELENGTH HYBRID SILICON LASER ARRAY

(75) Inventors: Matthew Sysak, Santa Barbara, CA (US); Richard Jones, San Mateo, CA (US)

(73) Assignee: Intel Corporation, Santa Clara, CA (US)

( * ) Notice: Subject to any disclaimer, the term of this patent is extended or adjusted under 35 U.S.C. 154(b) by 72 days.

(21) Appl. No.: 12/054,771

(22) Filed: Mar. 25, 2008

(65) Prior Publication Data

US 2009/0245316 A1  Oct. 1, 2009

(51) Int. Cl.
 *H01S 5/00* (2006.01)
(52) U.S. Cl. .................................. 372/50.121
(58) Field of Classification Search .............. 372/50.121
See application file for complete search history.

(56) References Cited

U.S. PATENT DOCUMENTS

| | | | |
|---|---|---|---|
| 4,997,246 A | 3/1991 | May et al. | |
| 5,317,587 A | 5/1994 | Ackley et al. | |
| 5,787,105 A | 7/1998 | Okamoto et al. | |
| 5,870,512 A | 2/1999 | Koch et al. | |
| 6,154,475 A | 11/2000 | Soref et al. | |
| 6,172,382 B1 | 1/2001 | Nagahama et al. | |
| 6,192,062 B1 * | 2/2001 | Sanchez-Rubio et al. | 372/92 |
| 6,403,975 B1 * | 6/2002 | Brunner et al. | 257/15 |
| 6,597,717 B1 | 7/2003 | Kneissl et al. | |
| 6,734,453 B2 | 5/2004 | Atanackovic et al. | |
| 6,785,430 B2 | 8/2004 | Paniccia | |
| 6,828,598 B1 | 12/2004 | Coffa et al. | |
| 6,836,357 B2 | 12/2004 | Wang et al. | |
| 6,891,865 B1 | 5/2005 | Ma | |
| 7,133,586 B2 | 11/2006 | Yegnanarayanan et al. | |
| 7,257,283 B1 | 8/2007 | Liu et al. | |
| 7,279,698 B2 | 10/2007 | Gardner | |
| 7,477,670 B2 | 1/2009 | Abeles et al. | |
| 2005/0025419 A1 | 2/2005 | Fish et al. | |
| 2005/0078727 A1 * | 4/2005 | Evans et al. | 372/50 |
| 2006/0045157 A1 | 3/2006 | Ratowsky et al. | |
| 2007/0170417 A1 | 7/2007 | Bowers | |
| 2008/0002929 A1 | 1/2008 | Bowers et al. | |

OTHER PUBLICATIONS

Park et al, "Design and Fabrication of Optically Pumped Hybrid Silicon-AlGaInAs Evanescent Lasers," Nov./Dec. 2006, IEEE, vol. 12, No. 6, 1657-1663.*
Jacobsen R.S. et al., "Strained Silicon As a New Electr-Optic Material" Nature Letters vol. 44, pp. 199-202, May 11, 2006.
Fang A.W. et al., "Heterogeneous Integration of Silicon and AlGaInAs for a Silicon Evanescent Laser", Novel In-Plane Semiconductor Lasers V, Proc of SPIE vol. 6133, 2006.
Park , H.; Fang, A. W.; Cohen, O.; Jones, R.; Paniccia, M. J.; Bowers, J. E. "Design and Fabrication of Optically Pumped Hybrid Silicon-AlGaInAs Evanescent Lasers" Selected Topics in Quantum Electronics, IEEE Journal of vol. 12, Issue 6, Nov.-Dec. 2006 pp. 1657-1663.
U.S. Appl. No. 60/760,629, filed Jan. 20, 2006, Bowers.
U.S. Appl. No. 60/795,064, filed Apr. 26, 2006, Bowers.

(Continued)

*Primary Examiner* — Patrick Stafford
(74) *Attorney, Agent, or Firm* — Schwabe, Williamson & Wyatt, P.C.

(57) ABSTRACT

A multi-wavelength array of hybrid silicon lasers and a method of fabricating such a device. The method may include providing a silicon-on-insulator wafer; patterning waveguides in the silicon-on-insulator wafer; providing a III-V wafer comprising multiple layers; applying quantum well intermixing to obtain a plurality of regions of different bandgaps within the III-V wafer; and bonding the silicon on insulator wafer with the III-V wafer.

10 Claims, 4 Drawing Sheets

OTHER PUBLICATIONS

Office Action for U.S. Appl. No. 11/479,459, mailed on Jun. 10, 2008.

Office Action for U.S. Appl. No. 11/479,459, mailed on Jan. 8, 2009.

Jones T.B. et al., "All-Optical Modulation in a Silicon Waveguide Based on a Single-Photon Process" IEEE Journal of Selected Topics in Quantum Electronics, vol. 14, No. 5, Sep./ Oct. 2008, pp. 1335-1342.

Bowers, J.E. et al., "Hybrid Silicon Evanescent lasers," Device Research Conference 2006 (DRC 2006), University Park, PA, Jun. 2006.

Fang, A.W., et al., "A Continuous-Wave Hybrid AlGaInAs-Silicon Evanescent Laser," IEEE Photonics Techonology Letters, vol. 18, No. 10, pp. 1143-1145, May 2006.

Bowers, J.E. et al., "A Technology for Integrating Active Photonic Devices on SOI Wafers," Indium Phosphide and Related Materials conference (IPRM 2006), Princeton, NJ, May 2006.

Park, H. et al., "An Optically Pumped Silicon Evanescent Laser Operating Continuous Wave and 60 °C," Optical Fiber Communication Conference (OFC 2006), paper OWH2, Mar. 2006.

Faist, Jerome, "Silicon Shines On" News and Views, Nature vol. 433, Feb. 17, 2005, pp. 691-692.

Park, H. et al., "Hybrid Silicon Evanescent Laser Fabricated With a Silicon Waveguide and III-V Offset Quantum Wells," Opt. Express, vol. 13, No. 23, pp. 9460-9464, Nov. 14, 2005.

Fang, A.W. et al., "An Optically Pumped Silicon Evanescent Laser," The 31$^{st}$ European Conference on Optical Communications (ECOC 2005), SECC, Glasgow, Scotland, Sep. 2005.

Skogen et al., "Monolithically Integrated Active Components: A Quantum—Well Intermixing Approach", IEEE Journal of selected topics in quantum electronics, vol. 11, No. 2, Mar./Apr. 2005, p. 343-355.

Fang A.W. et al., "Electrically Pumped Hybrid AlGaInAs-Silicon Evanescent Laser," Optics Express, Oct. 2, 2006, vol. 14, No. 20, pp. 9203-9210.

Fang A.W. et al., "Integrated Hybrid Silicon Evanescent Racetrack Laser and Photodetector", 12th OptoElectronics and Communications Conference, Yokohama Kanagawa, Japan (Invited), Jul. 2007.

Chang, Hsu-Hao et al., ":1310nm Silicon Evanescent Laser" 2007 Optical Society of America, Sep. 3, 2007, vol. 15, No. 18, pp. 11466-11471.

Park, H. et al. "Photonic Integration on Hybrid Silicon Evanescent Device Platform", Hindawi Publishing Corporation, Advances in Optical Technologies, vol. 2008, Article ID 682978.

Antonello Cutolo et al. "Silicon Electro-Optic Modulator Based on a Three Terminal device Integrated in a Low-Loss Single Mode SOI Waveguide", Journal of Lightwave Technology, vol. 15, No. 3, Mar. 1997. pp. 505-518.

Stankovic S. et al., "Hybrid III-V/ Silicon laser based on DVS-BCB Bonding", Proceedings 2008, Thirteenth Annual Symposium of the IEEE/ LEOA Benelux Chapter, Nov. 27-28, 2008, University of Twente, The Netherlands.

* cited by examiner

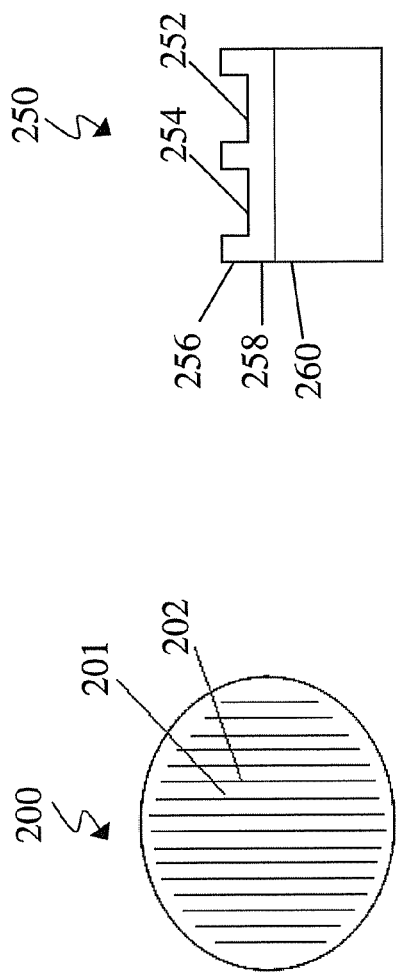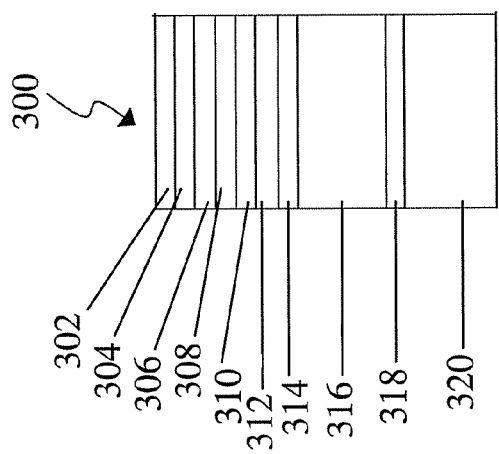

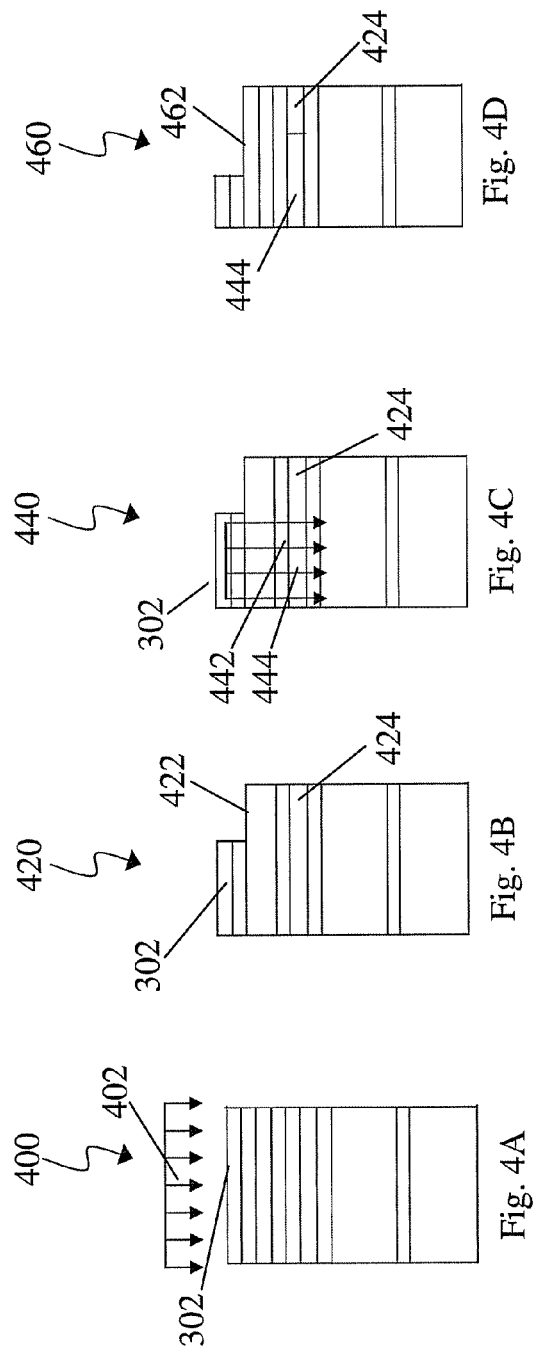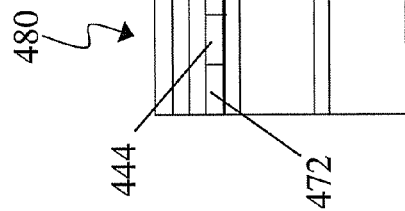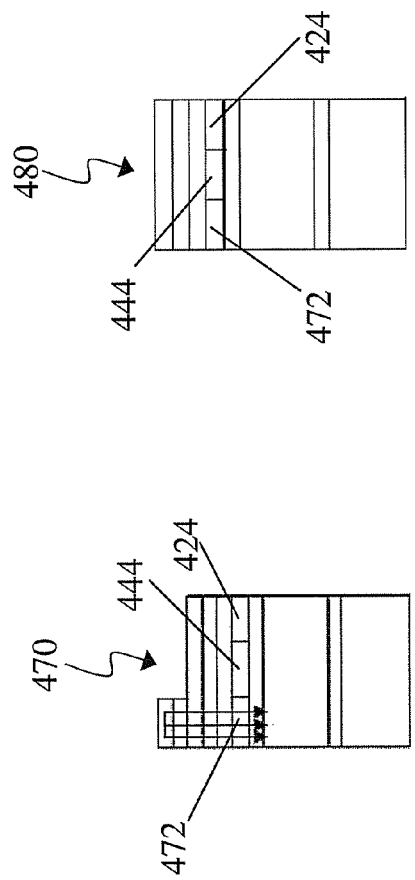

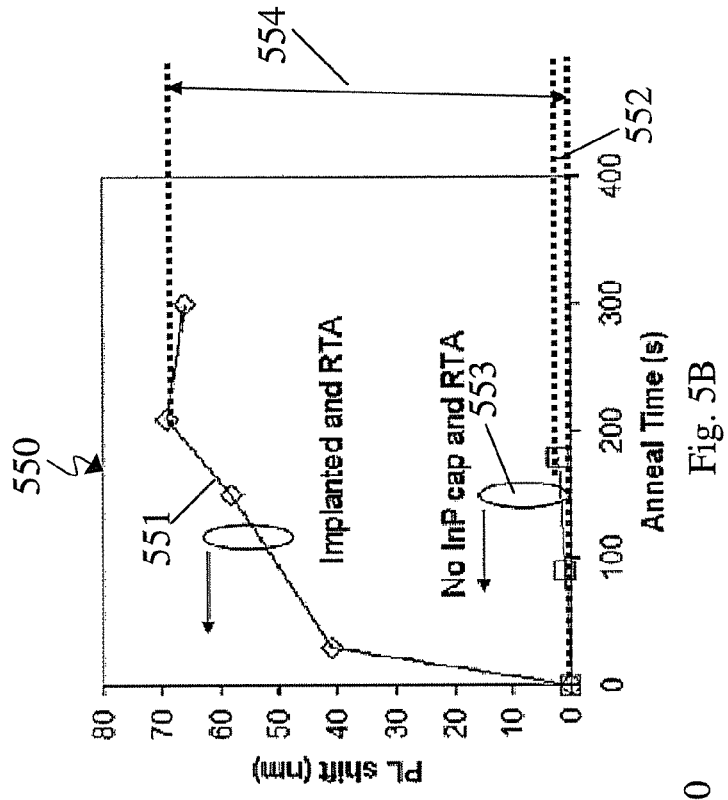
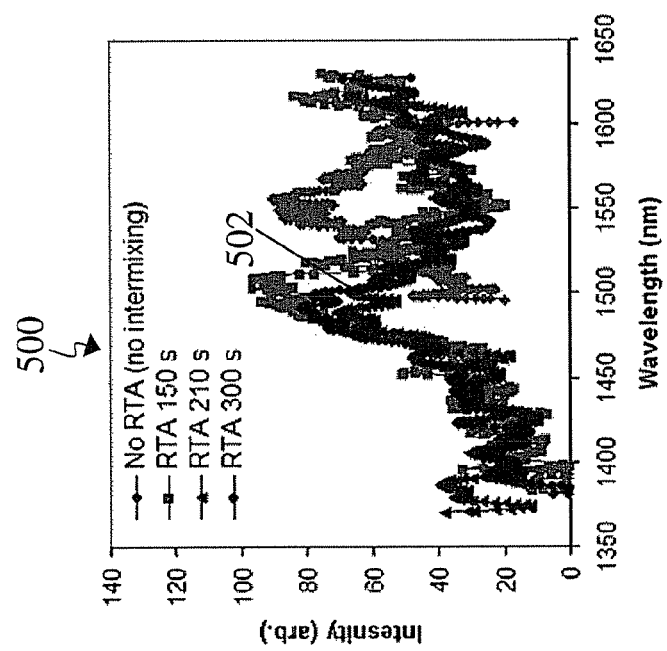
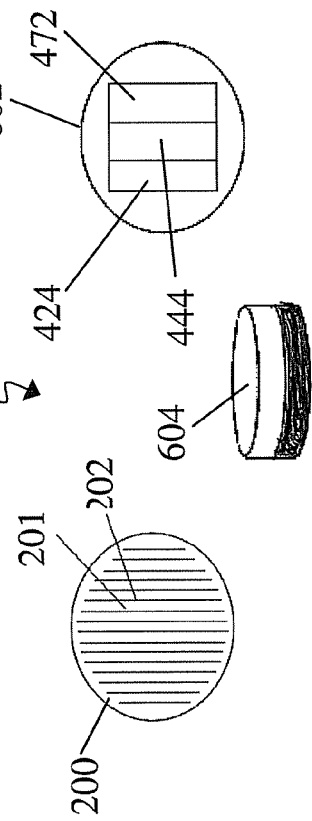

MULTI-WAVELENGTH HYBRID SILICON LASER ARRAY

FIELD OF THE INVENTION

The present invention relates to silicon lasers. More particularly, the present invention relates to a multi-wavelength array of hybrid silicon lasers fabricated using quantum well intermixing.

BACKGROUND OF THE INVENTION

A monolithic multi-wavelength laser array has a group of multiple lasers each of which is constructed to emit light at a specified wavelength. The lasers in the group can simultaneously emit light beams of different wavelength and can be selected individually when emission at a particular wavelength is called for.

Monolithic multi-wavelength laser arrays are useful in various applications, for example, color printing, full color digital film recording, color displays, and other applications related to optical communications.

Monolithic multi-wavelength light sources can be produced by the formation of multiple laser emission sites, or laser stripes, on a common substrate. This results in monolithic multi-wavelength arrays that can emit closely spaced beams. However, such monolithic laser arrays typically generate laser beams of limited wavelength coverage output as a single set of quantum wells is used as the gain medium.

BRIEF DESCRIPTION OF THE DRAWINGS

In order to better understand the present invention, and appreciate its practical applications, the following Figures are provided and referenced hereafter. It should be noted that the Figures are given as examples only and in no way limit the scope of the invention. Like components are denoted by like reference numerals.

FIG. 2A is a top view of a silicon-on-insulator wafer with patterned waveguides in accordance with embodiments of the present invention.

FIG. 2B is a cross sectional view of a silicon-on-insulator wafer showing shallow etched waveguides in accordance with embodiments of the present invention.

FIG. 3 illustrates a sample base structure of a multi-layered III-V wafer used for the quantum well intermixing process in accordance with embodiments of the present invention.

FIG. 4A illustrates an initial stage of the quantum well intermixing process in which phosphorous atoms are implanted into the cap layer to generate vacancies, or lattice defects, in accordance with embodiments of the present invention.

FIG. 4B illustrates a further stage of the quantum well intermixing process in which wet etching is applied for selectively removing the cap layer from an area where the original bandgap of the III-V quantum wells is to be preserved in accordance with embodiments of the present invention.

FIG. 4C illustrates a further stage of the quantum well intermixing process in which a III-V wafer is rapidly annealed until a desired wavelength for a second gain section (for example, shifting the bandgap to correspond to other wavelengths) is achieved in accordance with embodiments of the present invention.

FIG. 4D illustrates a further stage of the quantum well intermixing process in which wet etching is carried out for further removing the cap layer from a region in which it is desired to preserve the emission wavelength of the second gain section in accordance with embodiments of the present invention.

FIG. 4E illustrates a further stage of the quantum well intermixing process in which a III-V wafer is rapidly annealed until the desired wavelength for a third gain section is achieved in accordance with embodiments of the present invention.

FIG. 4F illustrates a further stage of the quantum well intermixing process in accordance with embodiments of the present invention.

FIG. 5A is a plot illustrating a photoluminescence spectrum from the quantum wells and barriers in the III-V wafer before and after the rapid thermal annealing (RTA) stage in the quantum well intermixing process in accordance with embodiments of the present invention.

FIG. 5B is a plot illustrating the photoluminescence shift with respect to anneal time for regions that contain the vacancies and regions where the InP sacrificial layer has been removed in accordance with embodiments of the present invention.

FIG. 6 illustrates the bonding of the pre-patterned Si and III-V wafers in accordance with embodiments of the present invention.

DETAILED DESCRIPTION OF THE PRESENT INVENTION

Figure 1:
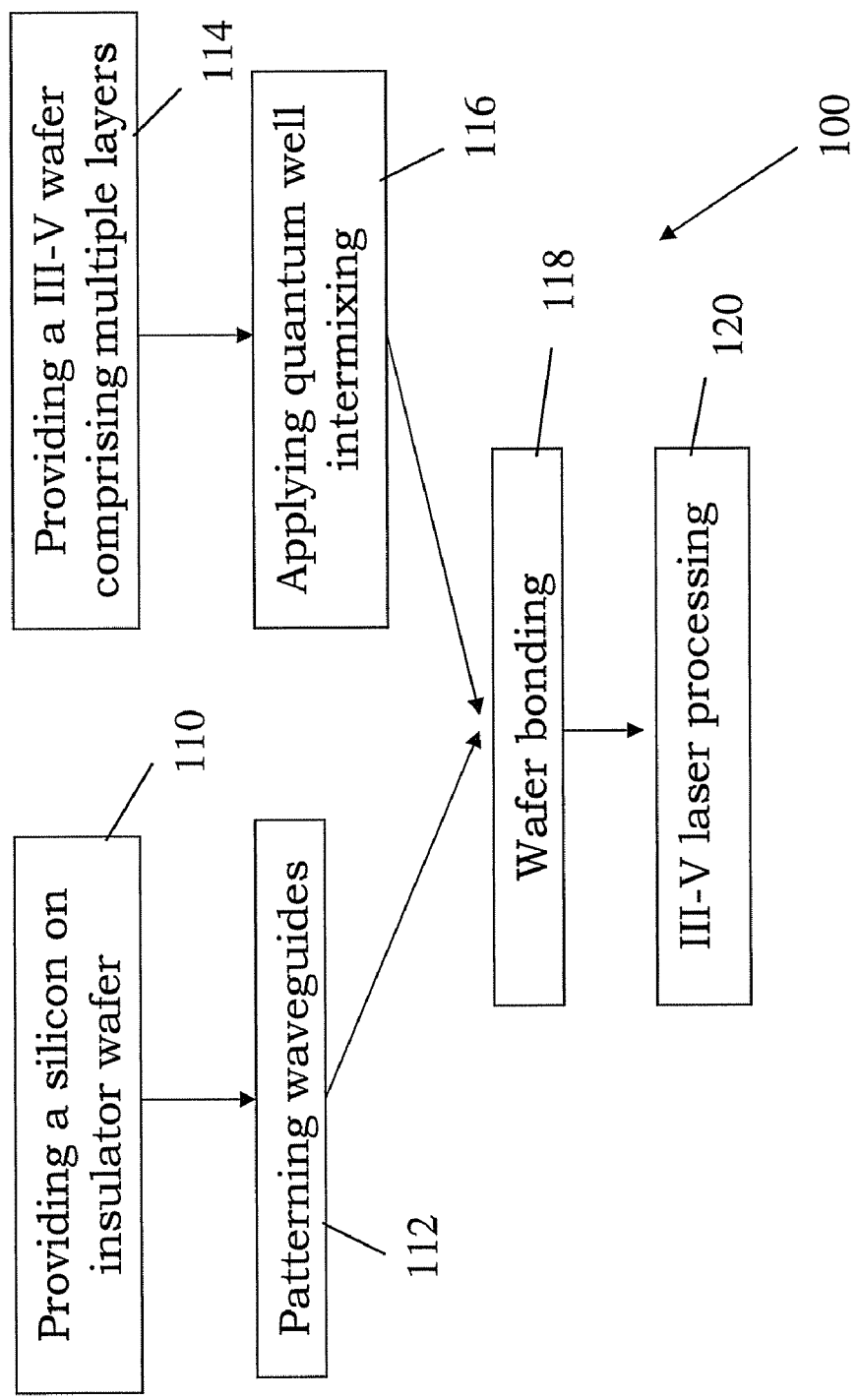
FIG. 1 is a flow chart illustrating the stages of a method for fabricating a wafer platform for a multi-wavelength array of hybrid silicon lasers in accordance with embodiments of the present invention.

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

According to embodiments of the present invention, quantum well intermixing is used (or quantum well disordering, as it is sometimes called). Quantum well intermixing is presently used for performing III-V integration of highly functional photonic circuits, and is being commercialized by a company named Intense Photonics for printing applications.

Embodiments of the present invention include a method for fabricating a multi-wavelength array of hybrid silicon lasers. This may be achieved, for example, by using a single bonding stage between a III-V wafer that has undergone a quantum well intermixing process and an insulator wafer which may have silicon applied to it. Following the bonding, an additional set of etching and metal deposition steps are used to define the laser structure. These may include removal of the InP substrate (in case of InP/InGaAsP which is an example of type of III-V wafer), etching a wide III-V mesa, depositing n-contact metal, implanting protons for electrical current confinement, and depositing p-contact metal. Bonding may be achieved in alternative ways, for example by direct bonding, bonding by adhesive (for example benzocyclobutene, also known as DVS-BCB).

A laser array fabricated in this manner is a key enabling technology for optical interconnect applications such as fully buffered Dual Inline Memory Module (FBD) links in future platforms. In this application, a large number of optical channels is desired (typically about 15 channels for FBD) using a simple and inexpensive manufacturing process. One such manufacturing process is that used for fabricating hybrid lasers, where a III-V structure is wafer bonded onto a silicon on insulator wafer. While this is potentially a low cost solution for laser arrays, the range of operating wavelengths in the array is limited based on the design of the quantum wells in the III-V gain regions. To achieve a large number of channels using a single quantum well design, it is possible to use tighter channel spacing. However, a narrow channel spacing places tighter requirements on additional components in the optical link and potentially drives up the overall cost of the transmission system.

According to embodiments of the present invention, a fabrication method is disclosed, employing a quantum well intermixing process, which allows more spacious channel spacing without a corresponding increase in the required performance of the components in the optical link.

The quantum well intermixing process may entail shifting the gain spectrum in different locations across the III-V wafer to enable a wider wavelength coverage and the fabrication of more laser channels using a single bonded III-V wafer.

A quantum well intermixing process according to embodiments of the present invention may simplify the fabrication process required for producing a wide gain bandwidth array of lasers. More specifically, a quantum well intermixing process may reduce fabrication stages and may improve the overall device yield as it requires performing only a single bond for a hybrid laser array. More particularly, a quantum well intermixing process may allow fabricating an array of lasers at multiple bandgaps without the need to bond multiple III-V wafers, and thus, allow lasers over a wide range of wavelengths in close physical proximity to one another. In addition, a quantum well intermixing process may allow fabricating a broadband array of lasers that does not require a multiple types of quantum wells for optical gain, and thus, has high optical confinement factor which benefits laser performance.

Reference is now made to the accompanying figures.

FIG. 1 is a flow chart illustrating stages of a method for fabricating a multi-wavelength array of hybrid silicon lasers 100 in accordance with embodiments of the present invention. A method according to one embodiment may include, for example, providing a silicon on an insulator wafer 110, patterning optical waveguides 112, providing a III-V wafer comprising multiple layers 114, applying a quantum well intermixing process to the III-V wafer 116, performing wafer bonding 118, fabricating III-V mesa structures, and applying metal for p-type and n-type contacts (III-V laser processing 120). Optical frequency selective gratings can also be added to the process before the wafer bonding in either the III-V or silicon wafers.

In accordance with embodiments of the present invention, the fabrication process begins with the definition of a set of shallow etched rib waveguides in the silicon on insulator wafer. Grating structures can also be patterned in the silicon waveguides shown in FIG. 2 to select a particular wavelength of light.

FIG. 2A is a top view of silicon-on-insulator wafer 200 with optical (shown as straight parallel) waveguides 201 in accordance with embodiments of the present invention. The waveguides may be straight, curved, toroidal, annular or other designs. In some embodiments of the present invention waveguides may be formed by grooves defined between elevated banks 202.

FIG. 2B is a cross sectional view of silicon on insulator wafer 250 showing etched waveguides 252 and 254 in accordance with embodiments of the present invention.

The figure also shows top layers 256, 258, and 260 of wafer 250 which correspond to silicon, silicon oxide and silicon respectively.

In accordance with embodiments of the present invention, laser cavities including an optical waveguide and an optical reflector are typically designed by using polished facets, ring resonator designs, gratings etched into the silicon, or gratings etched into the III-V wafer to define the lasing wavelength.

Simultaneously with the silicon processing, a quantum well intermixing process may be performed on the III-V wafer to obtain several regions of different gain sections (e.g. corresponding to different bandgaps) within the III-V wafer.

In accordance with embodiments of the present invention, the quantum well intermixing process comprises repeatedly performing selectively etching of the cap layer, each time at a different predetermined region to remove the cap layer from the III-V wafer at that region; and after each selective etching performing thermal annealing on the III-V wafer to cause interdiffusion of the interstitial atoms between quantum wells and barriers within the wafer at the region containing the cap layer creating a gain section bandgap (e.g., repeatedly performing thermal annealing keeps increasing the degree of diffusion and intermixing, and thus, leads to regions of different gain sections (e.g., shifting the bandgap to correspond to other wavelengths).

FIG. 3 illustrates an initial base structure of a multi-layered III-V wafer 300 used for the quantum well intermixing process in accordance with embodiments of the present invention. As seen, initial base structure 300 contains several layers (10 layers in this example) wherein layer 302 may comprise, for example, 500 nm sacrificial InP, layer 304 comprises 20 nm InGaAsP stop etch (photoluminescence ("PL") 1.03 µm), layer 306 comprises 100 nm n-InP doped with $10^{18}$ cm$^{-3}$ n-type dopant, layer 308 comprises 7.5/7.5 nm (2×) InGaAsP/InP superlattice (SL) doped with $10^{18}$ cm$^{-3}$ n-type dopant (PL 1.03 µm), layer 310 comprises 110 nm n-InP doped with $10^{18}$ cm$^{-3}$ n-type dopant, layer 312 comprises 100 nm InGaAsP (Well/Bar) (PL 1.03 µm), layer 314 comprises 250 nm InGaAsP (p-separate confined heterostructure) doped with $10^{17}$ cm$^{-3}$ p-type dopant (PL 1.3 µm), layer 316 comprises 1.5 µm p-InP doped with $10^{18}$ cm$^{-3}$ p-type dopant, layer 318 comprises 100 nm p-InGaAs doped with $10^{19}$ cm$^{-3}$ p-type dopant, and a 300 µm thick substrate 320 made of p-InP. An AlGaInAs/InP wafer may alternatively also be used.

FIG. 4A illustrates an initial stage 400 of the quantum well intermixing process in which $1\times10^{14}$ cm$^{-2}$ dose of Phosphorous atoms 402 is implanted into sacrificial InP cap layer 302, generating local irregularities (for example, local damages or vacancies in the crystal lattice) at a temperature of 200° C. in accordance with embodiments of the present invention.

FIG. 4B illustrates a further stage 420 of the quantum well intermixing process in which wet etching is applied for selectively removing sacrificial InP cap layer 302 from area 422 where the original bandgap (gain section 424) of the III-V quantum wells is to be preserved in accordance with embodiments of the present invention.

FIG. 4C illustrates a further stage 440 of the quantum well intermixing process in accordance with embodiments of the present invention. In this stage rapid thermal annealing (RTA) is performed for diffusing the vacancies in sacrificial InP cap layer 302 through the quantum wells and barriers in active region 442. As the vacancies travel through active region 442, they cause interdiffusion of interstitial atoms between the quantum wells and barriers. Interdiffusion may change the energy profile of the wells and barriers and alters the potential profile of active region 442. The modified energy profile then shifts the transition energy, and hence the wavelength of the first electron and hole state. Stage 440, e.g. a rapid thermal annealing (RTA) stage, may be continued until the desired wavelength for gain section 444 is reached.

FIG. 4D illustrates a further stage 460 of a quantum well intermixing process in accordance with embodiments of the present invention. In this stage wet etching may be carried out for removing sacrificial InP cap layer 302 from region 462 where preserving the emission wavelength of gain section 444 is desired.

The removal of sacrificial InP cap layer 302 may eliminate the source of vacancies that drive the disordering process.

FIG. 4E illustrates a further stage 470 of the quantum well intermixing process in accordance with embodiments of the present invention. In this stage RTA is repeated until the desired wavelength for gain section 472 is achieved. As some of the cap layer was previously removed zones of different degrees of interdiffusion are obtained.

FIG. 4F illustrates a further stage 480 of the quantum well intermixing process in accordance with embodiments of the present invention. In this stage the remaining cap layer 302 is removed.

FIG. 5A is a plot 500 illustrating the photoluminescence (PL) spectrum 502 from the quantum wells and barriers in the III-V wafer before and after RTA is carried out in the quantum well intermixing process in accordance with embodiments of the present invention. As can be seen in the plot, photoluminescence (PL) spectrum 502 gradually shifts to quantum well emission wavelength with increasing RTA time.

FIG. 5B is a plot 550 illustrating the shift of the photoluminescence spectrum to waves of shorter length with respect to anneal time for regions 551 that contain the P+ implant and regions 553 where the lnP sacrificial layer has been removed in accordance with embodiments of the present invention.

As can be seen, in one embodiment, when lnP capping layer 302 is absent from the structure in use, the shift 552 in the photoluminescence is minimal. However, in the case of a structure capped with a lnP layer 302 and implanted with phosphorous atoms 402 is undergoing annealing, a significant photoluminescence shift 554 occurs.

As can be seen in both FIGS. 5A and 5B, the photoluminescence peak is shifted 70 nm after 300 seconds of RTA.

Following the quantum well intermixing process described in FIG. 4 and the patterning of silicon on insulator wafers 200 described in FIG. 2, silicon on insulator wafers 200 and III-V wafers 602 are bonded together.

FIG. 6 illustrates the bonding 600 of pre-patterned Si wafer 200 and III-V wafer 602. The combined structure 604 then undergoes additional processing, mesa definition and p- and n-metal contacts, to fabricate the multi-wavelength laser array in accordance with embodiments of the present invention.

A precise alignment between pre-patterned Si wafer 200 and III-V wafer 602 for the bonding may not be required. However, rotation alignment may be necessary to ensure that the various bandgap regions are substantially perpendicular to the direction of the silicon waveguide.

A quantum well intermixing process, according to embodiments of the present invention, may enable research involved with the use of multiple wavelength highly integrated transmitter modules in I/O bandwidth bottlenecks.

A quantum well intermixing process, according to embodiments of the present invention, may include a wide range of available gain regions and high achievable optical confinement factors.

According to embodiments of the present invention, a Quantum Well intermixing process may facilitate the provision of an array of lasers covering a wide wavelength range using a single wafer bond step.

While the invention has been described with respect to a limited number of embodiments, it will be appreciated that many variations, modifications and other applications of the invention may be made. Embodiments of the present invention may include other apparatuses for performing the operations herein. The appended claims are intended to cover all such modifications and changes.

The invention claimed is:

1. A wafer platform device for a multi-wavelength array of hybrid silicon lasers, the lasers in the array capable of emitting light at different wavelengths simultaneously, the device comprising:
   a silicon-on-insulator wafer including patterned parallel waveguides; and
   a III-V wafer bonded to the silicon-on-insulator wafer, and comprising multiple layers having a plurality of different gain sections within the III-V wafer, wherein the different gain sections are formed using quantum well intermixing, and wherein the different gain sections are oriented perpendicularly to the patterned parallel waveguides, wherein the multiple layers of the III-V wafer comprise an n-type InGaAsP/InP superlattice layer and an n-type InP layer, wherein the n-type InP layer is disposed between the n-type InGaAsP/InP superlattice layer and the silicon-on-insulator wafer.

2. The device of claim 1, wherein the different gain sections comprise local irregularities in the crystal structure of the III-V wafer.

3. The device of claim 1, wherein the different gain sections comprise interstitial atoms in different degrees of diffusion.

4. The device of claim 3, wherein the interstitial atoms comprise phosphorous atoms.

5. The device of claim 1, wherein the III-V wafer comprises InP/InGaAsP or AlGaInAs/InP.

6. The device of claim 1, wherein the multiple layers of the III-V wafer further comprise a p-type InGaAs layer, a p-type InP layer on the p-type InGaAs layer, a first InGaAsP layer on the p-type InP layer, a second InGaAsP layer on the first InGaAsP layer, another n-type InP layer on the second InGaAsP layer, wherein the n-type InGaAsP/InP superlattice layer is disposed between the n-type InP layer and the other n-type InP layer.

7. The device of claim 1, wherein the different gain sections are parallel to each other.

8. The device of claim 1, wherein the multiple layers of the III-V wafer further comprise another n-type InP layer, wherein the n-type InGaAsP/InP superlattice layer is disposed between the n-type InP layer and the other n-type InP layer.

9. The device of claim 8, wherein the multiple layers of the III-V wafer further comprise an InGaAsP layer and a p-type InP layer, wherein the InGaAsP layer is disposed between the p-type InP layer and the other n-type InP layer.

10. The device of claim 1, wherein the multiple layers of the III-V wafer further comprise a p-type InGaAs layer, a p-type InP layer on the p-type InGaAs layer, a first InGaAsP layer on the p-type InP layer, a second InGaAsP layer on the first InGaAsP layer, another n-type InP layer on the second InGaAsP layer, wherein the n-type InGaAsP/InP superlattice layer is disposed between the n-type InP layer and the other n-type InP layer.

* * * * *